*United States Patent* [19]

Kwon et al.

[11] Patent Number: 5,748,536
[45] Date of Patent: May 5, 1998

[54] DATA READ CIRCUIT FOR A NONVOLATILE SEMICONDUCTOR MEMORY

[75] Inventors: Suk-Chun Kwon; Jim-Ki Kim, both of Seoul, Rep. of Korea

[73] Assignee: Samsung Electronics Co., Ltd., Suwon, Rep. of Korea

[21] Appl. No.: 652,654

[22] Filed: May 28, 1996

[30] Foreign Application Priority Data

May 27, 1995 [KR] Rep. of Korea ............ 13572/1995

[51] Int. Cl.$^6$ ........................................... G11C 16/02
[52] U.S. Cl. ........................ 365/185.25; 365/185.17; 365/189.05
[58] Field of Search .................... 365/185.25, 185.21, 365/185.2, 189.05, 187.17

[56] References Cited

U.S. PATENT DOCUMENTS

5,253,201 10/1993 Atsumi et al. ............ 365/185.21
5,268,867 12/1993 Momodomi et al. ....... 365/185.21
5,305,273 4/1994 Jinbo .......................... 365/185.21
5,473,565 12/1995 Suh et al. ................... 365/185.13

*Primary Examiner*—David C. Nelms
*Assistant Examiner*—Michael T. Tran
*Attorney, Agent, or Firm*—Cushman Darby & Cushman IP Group of Pillsbury Madison & Sutro LLP

[57] ABSTRACT

A data read-out circuit is provided for a nonvolatile semiconductor memory having at least one bit line and a plurality of memory transistors connected to the bit line, and including at least one data sense line. The data read-out circuit includes a precharge set circuit, a current supplying circuit and a sense amplifier. The precharge set circuit is connected between the bit line and the data sense line and is operative to set a voltage of the bit line to a preselected precharge voltage lower than a power supply voltage. The current supplying circuit supplies a precharge current to the data sense line such that the bit line is precharged to the precharge voltage. The current supplying circuit also supplies a sense current lower than the precharge current, such that variation of the precharge voltage based on data stored in a selected memory transistor connected to the bit line is amplified to the voltage variation on the data sense line. The sense amplifier senses and latches data according to the amplified voltage variation.

22 Claims, 8 Drawing Sheets

DATA READ CIRCUIT FOR A NONVOLATILE SEMICONDUCTOR MEMORY

BACKGROUND OF THE INVENTION

1. Field of the Invention

The present invention relates to a data read circuit for a nonvolatile semiconductor memory, and more particularly to an electrically erasable and programmable read only memory (hereinafter, referred to as "EEPROM") which senses data stored in memory cells at a high speed and stores the sensed data in data latches. The present application is based upon Korean Application No. 13572/1995, which is incorporated herein by reference.

2. Description of the Related Art

Figure 1:
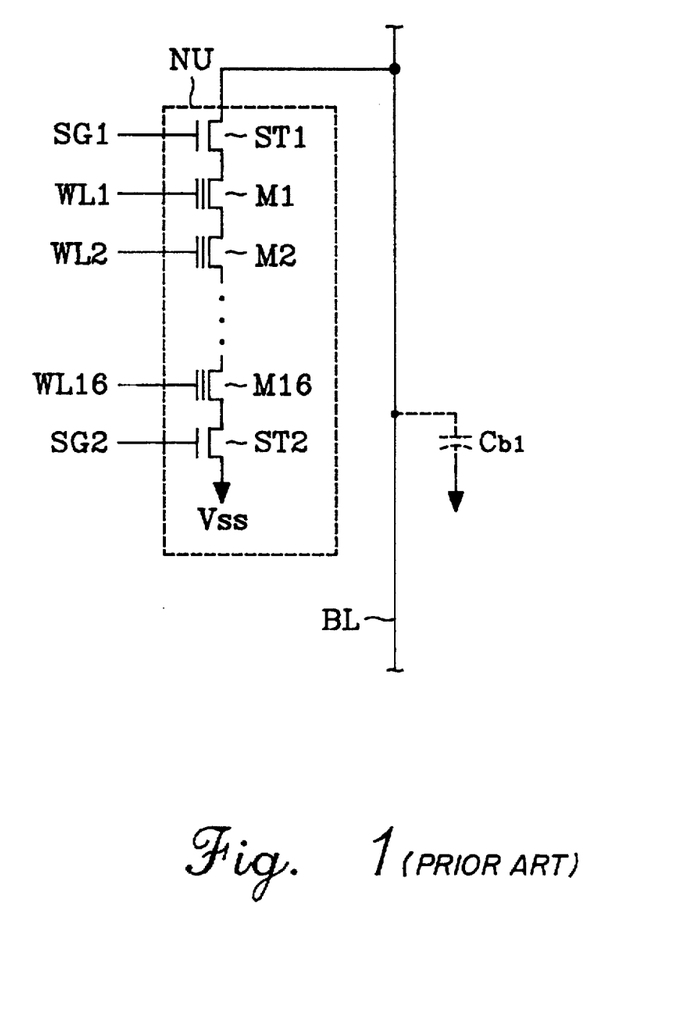
FIG. 1 is an equivalent circuit diagram of a conventional NAND cell unit connected to a bit line.

To increase memory capacity, EEPROMs having NAND structured memory cells (hereinafter, referred to as "NAND cell units") have been developed. FIG. 1 is an equivalent circuit diagram of a NAND cell unit connected to a single bit line BL. As shown, a single NAND cell unit NU includes first and second selection transistors ST1 and ST2, and memory transistors M1 to M16 whose drain-source paths are connected in series between a source of first selection transistor ST1 and a drain of second selection transistor ST2.

Each of the memory transistors M1 through M16 has its drain and source spaced apart by its channel. Further, its floating gate is formed on a tunnel oxide film over the channel and its control gate is formed on an intermediate dielectric film over the floating gate. A drain of the first selection transistor ST1 is connected to the bit line BL and a source of the second selection transistor ST2 is connected to a common source line which is grounded during a read operation. With the NAND structure described above, since the number of contact holes connected to the bit line per memory transistor is reduced, EEPROMs having a high density memory capacity can be accomplished.

Before programming the memory transistors, an erase operation must be performed. The erasure of memory transistors M1 to M16 is accomplished by applying an erase potential, such as 20 volts, to a semiconductor substrate and applying a reference potential, such as 0 volts, to word lines WL1 to WL16 connected to the control gates of memory transistors M1 to M16. Electrons stored by the floating gates of memory transistors M1 to M16 are extracted by Fowler-Nordheim tunneling (F-N tunneling), and thereby the memory transistors M1 to M16 are changed into depletion mode transistors. It is assumed that erased memory transistors store logic "0" data.

After the erase operation, a program or write operation is performed. For example, assume that memory transistor M1 is to be programmed. A data latch connected to bit line BL provides 0 volts to bit line BL. Further, a power supply voltage $V_{CC}$ is applied to first selection line SG1 and a program voltage, such as 18 volts, is applied to a selected word line WL1. Meanwhile, a pass voltage, such as 10 volts, is applied to unselected word lines WL2 to WL16 and a reference potential of 0 volts is applied to the semiconductor substrate. Electrons accumulate to the floating gate of memory transistor M1 by F-N tunneling, and thereby memory transistor M1 is changed into an enhancement mode transistor. It is assumed that a programmed memory transistor stores logic "1" data.

To read out data stored in a selected memory transistor M2, 0 volts is applied to selected word line WL2 and the power supply voltage $V_{cc}$ is applied to first and second selection lines SG1 and SG2 and to unselected bit lines WL1 and WL3 to WL16. Meanwhile, current is supplied to the bit line BL. If the selected memory transistor M2 stores logic "0" data, memory transistor M2 turns on and bit line BL is thereby discharged to 0 volts. To the contrary, if the selected memory transistor M2 stores logic "1" data, memory transistor M2 turns off and bit line BL is thereby charged to a preselected voltage. Therefore, the data latch connected to bit line BL stores data corresponding to the charging or discharging of bit line BL. The above-mentioned erasure, program and read operations are disclosed in U.S. Pat. No. 5,473,563, which is assigned to the assignee of the present invention, and the contents of which are incorporated herein by reference.

In the above-described read operation, a read voltage is applied to a selected memory transistor, thereby supplying a preselected current, such as a current value of about 4 µA, to bit line BL without precharging bit line BL. Then data stored in the selected memory transistor is sensed according to the charging or discharging of the bit line. After the sensing operation, the data latch latches the data stored by the selected memory transistor. This operation requires a considerable amount of data sensing time of over about 2 µsec. Moreover, as the memory capacity increases, so does the number of cell strings, i.e. NAND cell units, connected to the bit line BL, thereby extending the length of the bit line. This increases a parasitic capacitance $C_{bl}$ of the bit line BL and thereby the time required for charging or discharging the bit line BL is increased. Consequently, the data readout speed becomes considerably slow.

SUMMARY OF THE INVENTION

It is therefore an object of the present invention to provide a nonvolatile semiconductor memory which is capable of sensing data at a high speed irrespective of the length of bit lines.

To achieve this and other objects, according to one aspect of the present invention, a data read-out circuit is provided. For a nonvolatile semiconductor memory having at least one bit line and a plurality of memory transistors connected to the bit line, and including at least one data sense line, the data read-out circuit includes a precharge set circuit, a current supplying circuit and a sense amplifier. The precharge set circuit is connected between the bit line and the data sense line and is operative to set a voltage of the bit line to a preselected precharge voltage lower than a power supply voltage. The current supplying circuit supplies a precharge current to the data sense line such that the bit line is precharged to the precharge voltage. The current supplying circuit also supplies a sense current lower than the precharge current, such that variation of the precharge voltage based on data stored in a selected memory transistor connected to the bit line is amplified to the voltage variation on the data sense line. The sense amplifier senses and latches data according to the amplified voltage variation.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, wherein.

DETAILED DESCRIPTION OF THE PREFERRED EMBODIMENTS

An EEPROM of the present invention is, for example, fabricated on a common chip using CMOS manufacturing technologies. In such an EEPROM, depletion mode n-channel MOS transistors have a threshold voltage of about −2 to −3 volts (hereinafter, referred to as D-type transistors), enhancement mode n-channel MOS transistors have a threshold voltage of about 0.7 to 1 volts (hereinafter, referred to as N-type transistors) and p-channel MOS transistors have a threshold voltage of about −0.8 to −1 volts (hereinafter, referred to as P-type transistors).

Figure 2:
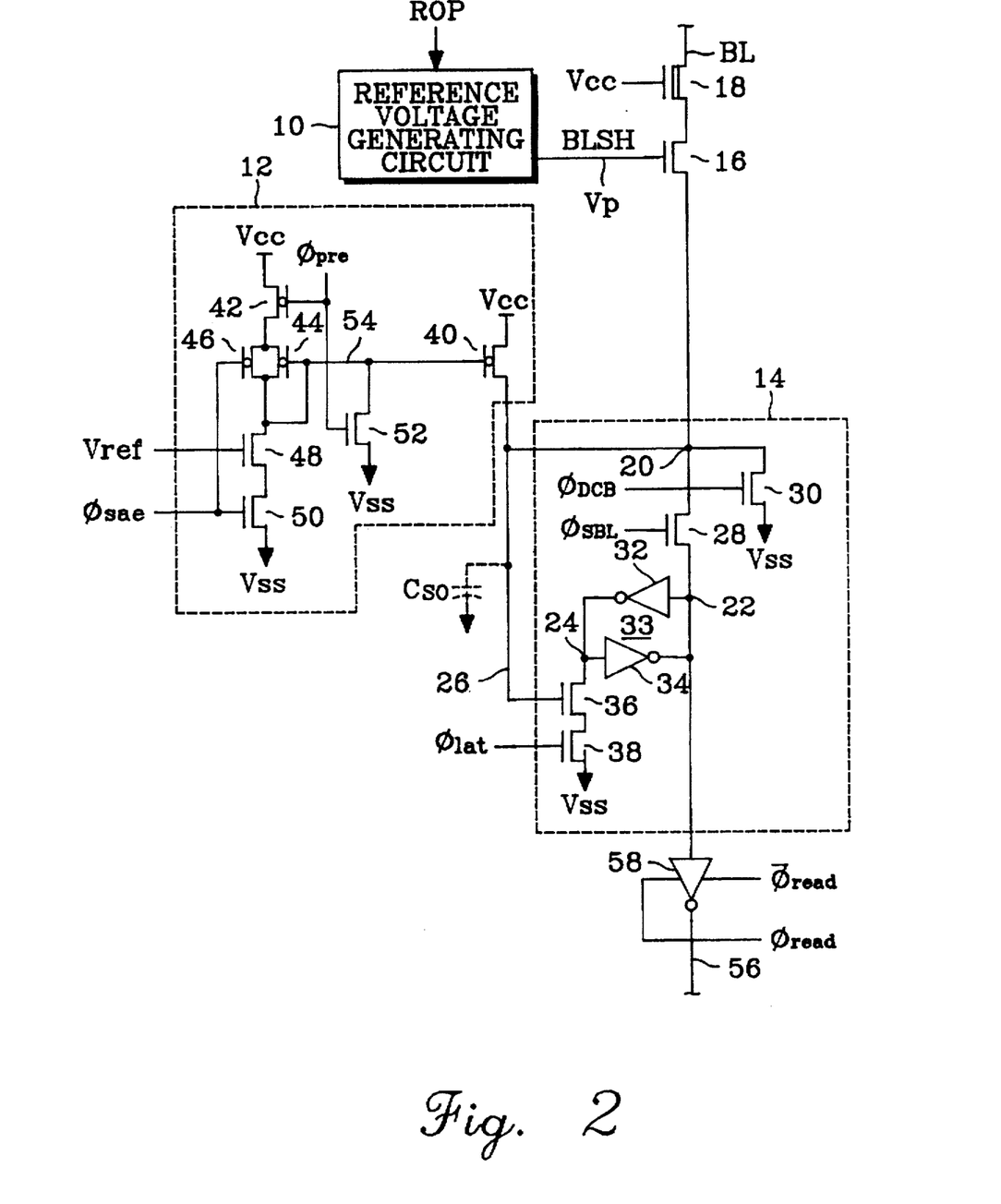
FIG. 2 is a schematic circuit diagram of a data read-out circuit connected to a bit line according to an embodiment of the present invention.

FIG. 2 illustrates a data read-out circuit connected to a bit line according to an embodiment of the present invention. As shown in FIG. 2, the drain of a D-type transistor 18 for preventing a high voltage transmission onto a bit line BL is connected to the bit line BL and a power supply voltage $V_{cc}$ is applied to the gate thereof. The source of D-type transistor 18 is connected to the drain of an N-type transistor 16 which sets a precharge voltage level onto the bit line BL during a read operation.

The gate of N-type transistor 16 is connected to a reference voltage generating circuit 10 which generates a precharge voltage level control signal BLSH for controlling the precharge voltage level of the bit line BL. In response to a read operation control signal ROP, the reference voltage generating circuit 10 produces a precharge voltage level control signal BLSH having a reference voltage level $V_P$ and which controls the precharge voltage level on the bit line BL to be less than one third of the level of power supply voltage $V_{cc}$. A precharge set circuit according to an embodiment of the invention is therefore comprised of the reference voltage generating circuit 10 and the N-type transistor 16.

The source of N-type transistor 16 is connected to a data sense and latch circuit 14, i.e. a sense amplifier, which serves to sense and latch data for a selected memory transistor. The sense amplifier 14 includes an N-type transistor 28 whose drain-source path is connected between nodes 20 and 22, an N-type transistor 30 whose drain-source path is connected between the node 20 and a ground potential $V_{SS}$, inverters 32 and 34 cross-coupled between nodes 22 and 24, and N-type transistors 36 and 38 whose drain-source paths are connected in series between the node 24 and the ground potential $V_{SS}$.

Inverters 32 and 34 provide a data latch circuit 33, and N-type transistors 36 and 38 and a data sense line 26 provide a data sense circuit. The gate of N-type transistor 30 is connected to an initialization control signal $\phi_{DCB}$, and the gate of N-type transistor 28 is connected to an isolation control signal $\phi_{SBL}$. In response to the isolation control signal $\phi_{SBL}$, the gate of N-type transistor 28 functions to isolate nodes 20 and 22. The gate of N-type transistor 36 is connected to node 20 through data sense line 26, and the gate of N-type transistor 38 is connected to a data latch control signal $\phi_{lat}$. N-type transistors 28 and 30 serve to initialize node 24 to a logic "high" level in response to control signals $\phi_{SBL}$ and $\phi_{DCB}$.

A current supply circuit 12 of a current mirror type, which is connected to node 20, supplies a precharge current for precharging bit line BL and data sense line 26 and also supplies a sensing current for sensing data stored in the memory transistor connected to the bit line BL. The current supply circuit 12 includes P-type transistors 40 to 46 and N-type transistors 48 to 52. The source-drain path of P-type transistor 40 is connected between power supply voltage $V_{cc}$ and node 20. The source-drain path of P-type transistor 42 is connected in series with the source-drain paths of P-type transistors 44 and 46, which are connected in parallel to each other, and drain-source paths of N-type transistors 48 and 50 are connected in series between the power supply voltage $V_{cc}$ and the ground potential $V_{SS}$. The gates of P-type transistors 40 and 44 are connected through a line 54, and the drain-source path of N-type transistor 52 is connected between line 54 and ground potential $V_{SS}$. The gates of N-type transistor 52 and P-type transistor 42 are connected to a precharge control signal $\phi_{pre}$. The gate and drain of P-type transistor 44 are connected in common and the gate of N-type transistor 48 is connected to a reference voltage $V_{ref}$. A sense control signal $\phi_{sae}$ is applied to the gate of N-type transistor 50.

N-type transistor 52 pulls down line 54 to the ground potential $V_{SS}$ in response to the precharge control signal $\phi_{pre}$, thereby rendering P-type transistor 40 conductive. Thus, bit line BL is precharged. Since P-type transistor 40 is fully conductive, bit line BL is rapidly precharged. Thereafter, line 54 goes to a predetermined voltage level in response to the sense control signal $\phi_{sae}$ and P-type transistor 40 is thereby slightly turned on to supply minute current on data sense line 26. The data stored in data latch circuit 33 comprised of inverters 32 and 34 is output to a line 56 via a tristate inverter 58 responsive to a read control signal $\phi_{read}$ and its complement signal $\overline{\phi}_{read}$. Line 56 is connected to a data output buffer by way of a column selection circuit (not shown). A capacitor $C_{so}$ is shown in a phantom line as a parasitic capacitor of the data sense line 26.

Figure 3:
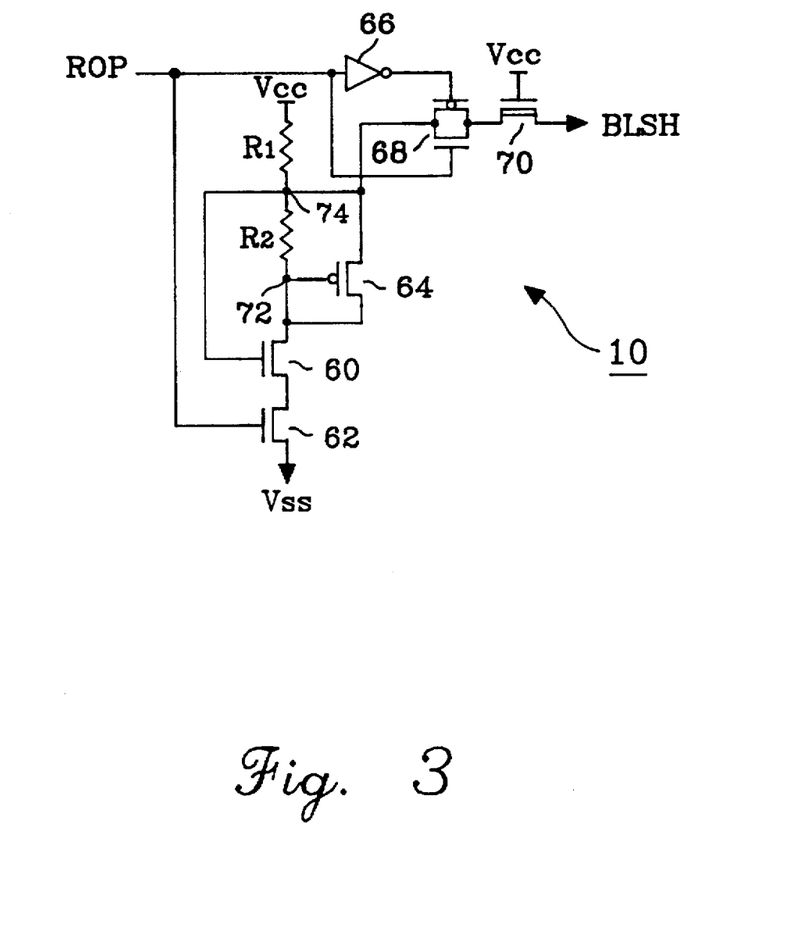
FIG. 3 is a schematic circuit diagram of a reference voltage generating circuit of FIG. 2.

FIG. 3 is a schematic circuit diagram of a reference voltage generating circuit 10 of FIG. 2. The reference voltage generating circuit 10 includes resistors R1 and R2 and N-type transistors 60 and 62 connected in series between the power supply voltage $V_{cc}$ and the ground potential $V_{SS}$. A P-type transistor 64 has its gate and source connected in common to a connecting node 72 at which resistor R2 is connected to the drain of N-type transistor 60. The drain of P-type transistor 64 and the gate of N-type transistor 60 are connected in common to a connecting node 74 to which resistors R1 and R2 are connected. The drain or source of a transmission gate 68 where a P-type transistor is connected in parallel with an N-type transistor is connected to the connecting node 74, and the source or drain of transmission gate 68 is connected to the drain of a D-type transistor 70. The gate of the P-type transistor of transmission gate 68 is connected to the output terminal of an inverter 66, and the gate of the N-type transistor thereof is connected to the input terminal of inverter 66. The input terminal of inverter 66 and the gate of N-type transistor 62 are connected to the read operation control signal ROP.

The reference voltage generating circuit 10 serves to generate the predetermined reference voltage $V_P$ in response to the read operation control signal ROP. In a preferred embodiment of the present invention, the reference voltage generating circuit 10 generates the reference voltage $V_P$ having a trip voltage of the sense amplifier 14. For example, when the power supply voltage $V_{cc}$ is 3.3 volts, the reference voltage $V_P$ is about 2 volts.

Figure 4A:
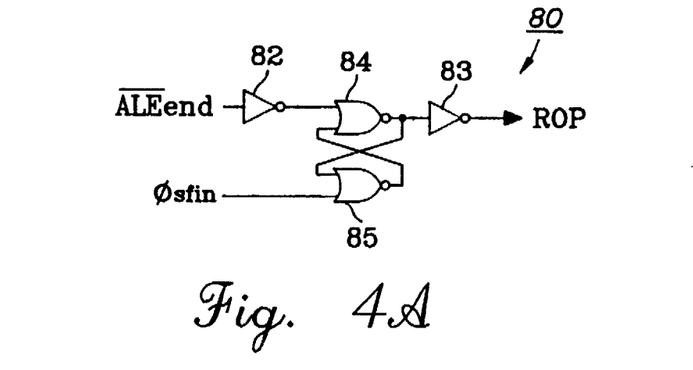
FIGS. 4A to 4E are schematic circuit diagrams of control signal generating circuits which generate various control signals of FIG. 2.
Figure 4B:
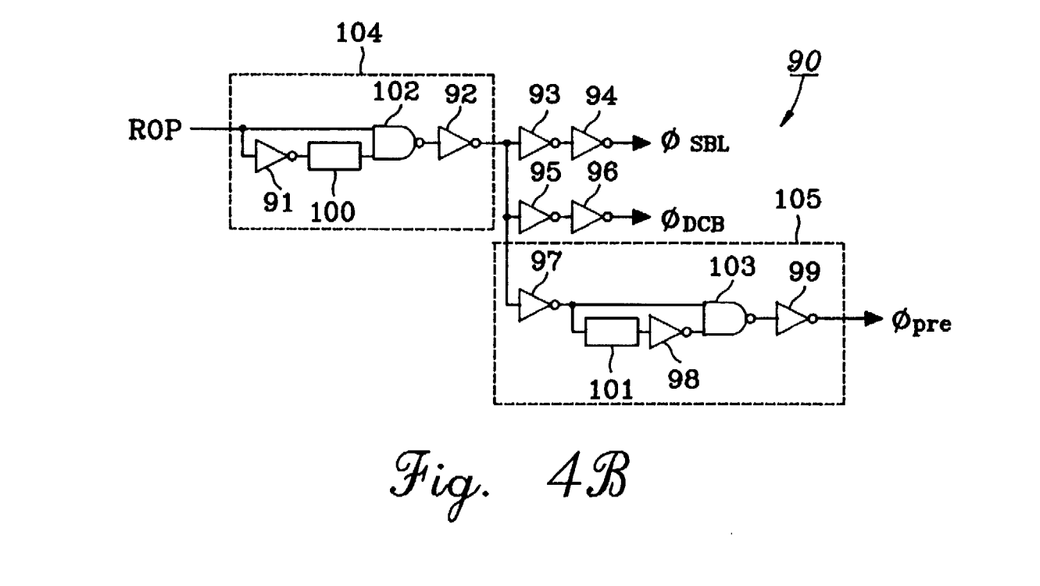
Figure 4C:
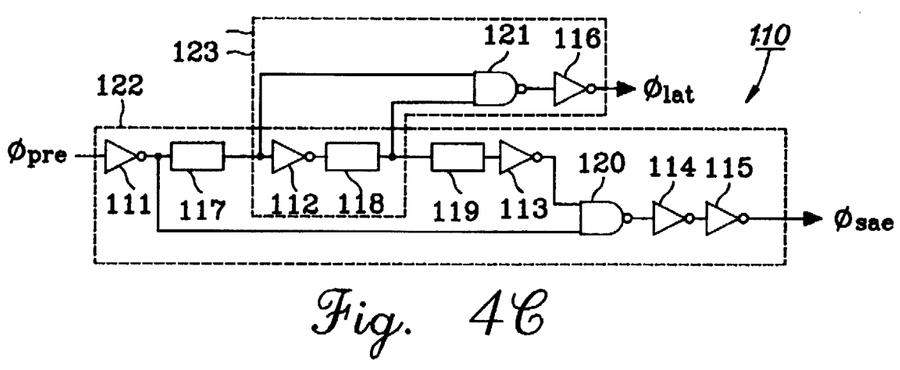
Figure 4D:
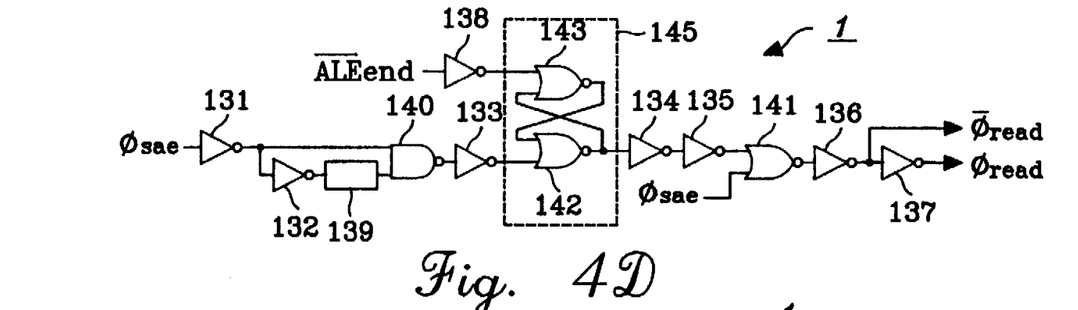
Figure 4E:
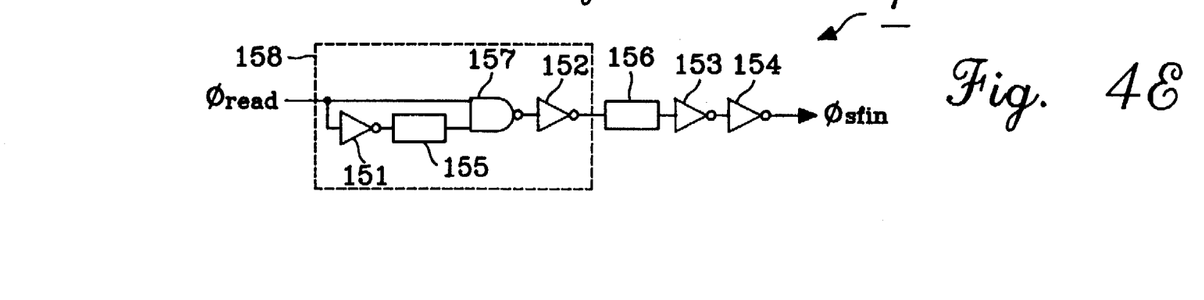
Figure 5:
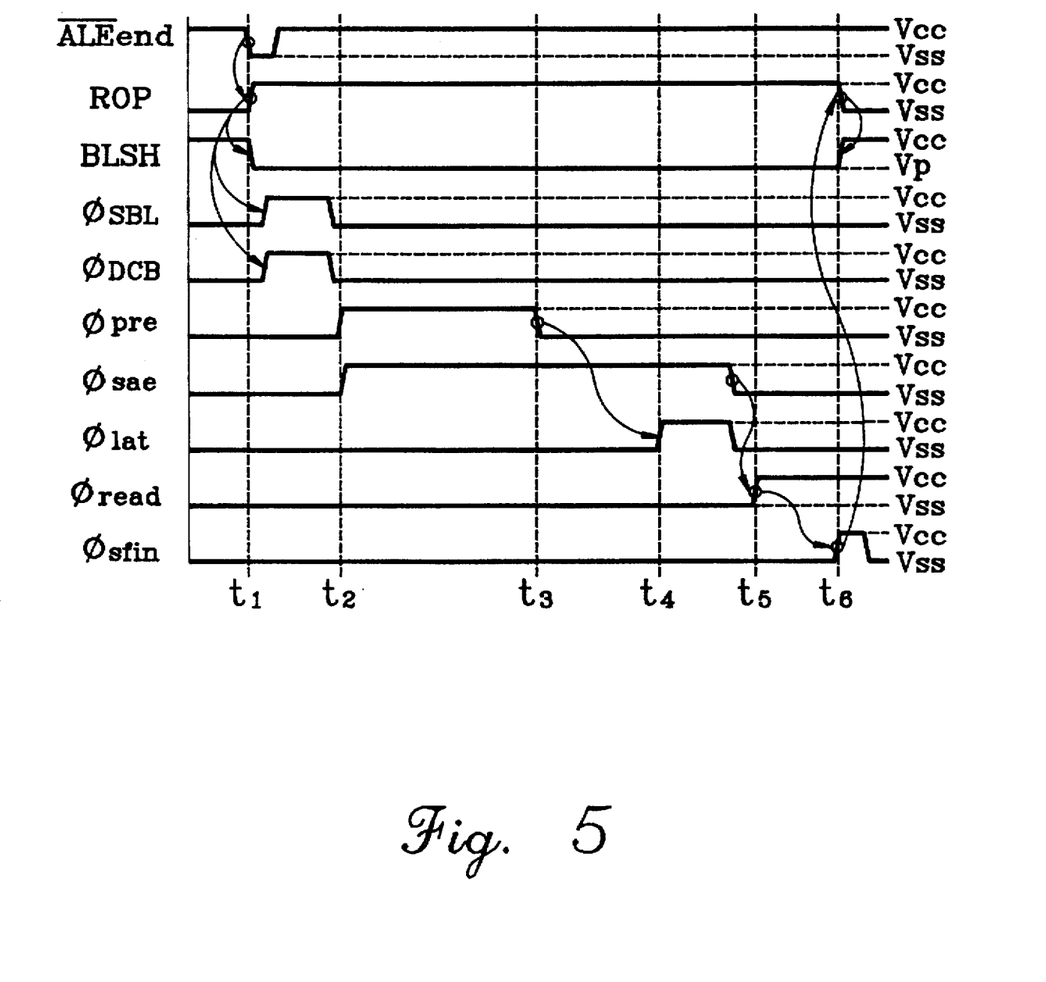
FIG. 5 is a timing diagram of the various control signals of FIG. 2.

FIGS. 4A to 4E are schematic circuit diagrams of control signal generating circuits, which generate various control signals of FIG. 2, and FIG. 5 is a timing diagram of the various control signals of FIG. 2. When address signals received through address input pins are latched to an address input buffer (not shown), an address latch ending signal $\overline{ALE}_{end}$ with a logic "low" level short pulse is generated. A circuit for generating the signal $\overline{ALE}_{end}$ is disclosed in U.S. patent application Ser. No. 08/537,615, filed on Oct. 2, 1995 and assigned to the assignee of the present invention, the contents of which are incorporated herein by reference.

As shown in FIG. 4A, a read operation control signal generating circuit 80 includes inverters 82 and 83 and NOR gates 84 and 85. NOR gates 84 and 85 are cross-coupled to form a flip-flop circuit.

As illustrated in FIG. 5, the read operation control signal generating circuit 80 serves to produce the read operation control signal ROP changing from a logic "low" level to a logic "high" level in response to the transition of the address latch ending signal $\overline{ALE}_{end}$ to a logic "low" level, and to disable the read operation control signal ROP from the logic "high" level to a logic "low" level in response to the transition of a read ending control signal $\phi_{sfin}$ to a logic "high" level.

As shown in FIG. 4B, a control signal generating circuit 90 includes inverters 91 to 99, delay circuits 100 and 101 and NAND gates 102 and 103. The control signal generating circuit 90 serves to produce the isolation control signal $\phi_{SBL}$, the initialization control signal $\phi_{DCB}$ and the precharge control signal $\phi_{pre}$ in response to the read operation control signal ROP from the read operation control signal generating circuit 80.

As illustrated in FIG. 5, a first clock generating circuit 104, which includes inverters 91 and 92, delay circuit 100, and NAND gate 102, serves to generate a logic "high" level clock determined by a time delay of the delay circuit 100 in response to the transition of the read operation control signal ROP to a logic "high" level. The inverters 94 and 96 respectively output the isolation control signal $\phi_{SBL}$ with a logic "high" level clock and the initialization control signal $\phi_{DCB}$ with a logic "high" level clock in response to the logic "high" level clock from the first clock generating circuit 104. A second clock generating circuit 105, which includes inverters 97 to 99, delay circuit 101, and NAND gate 103, serves to generate a logic "high" level clock determined by a time delay of delay circuit 101, i.e. the precharge control signal $\phi_{pre}$, in response to the transition of the clock from the first clock generating circuit 104 to a logic "low" level.

In FIG. 4C there is shown a sense and latch control signal generating circuit 110 for generating the sense control signal $\phi_{sae}$ and the latch control signal $\phi_{lat}$ in response to the precharge control signal $\phi_{pre}$. As further illustrated in FIG. 5, a sense control signal generating circuit 122, which includes inverters 111 to 115, delay circuits 117 to 119 and NAND gate 120, serves to generate a logic "high" level clock with a pulse width determined by the summation of time delays of delay circuits 117 to 119, i.e. the sense control signal $\phi_{sae}$, in response to the transition of the precharge control signal $\phi_{pre}$ to a logic "high" level. A latch control signal generating circuit 123, which includes inverters 112 and 116, delay circuit 118, and NAND gate 121, serves to generate a logic "high" level clock with a pulse width determined by the time delay of the delay circuit 118, i.e. the latch control signal $\phi_{lat}$, in response to the precharge control signal $\phi_{pre}$ through inverter 111 and delay circuit 117.

As shown in FIGS. 4D and 5, a read control signal generating circuit 130 generates the read control signal $\phi_{read}$ and its complement signal $\overline{\phi}_{read}$ in response to the sense control signal $\phi_{sae}$ from sense control signal generating circuit 122 and the address latch ending signal $\overline{ALE}_{end}$. Read control signal generating circuit 130 includes inverters 131 to 138, delay circuit 139, NAND gate 140 and NOR gates 141 to 143.

A flip-flop circuit 145, which includes NOR gates 142 and 143, is initialized to a logic "high" level signal in response to the transition of the address latch ending signal $\overline{ALE}_{end}$ to a logic "low" level, prior to a read operation. Flip-flop circuit 145 generates a signal changing from a logic "high" level to a logic "low" level in response to the transition of the sense control signal $\phi_{sae}$ from the sense control signal generating circuit 122 to a logic "low" level, thereby causing the read control signal $\phi_{read}$ to be changed from a logic "low" level to a logic "high" level. When the sense control signal $\phi_{sae}$ fed to NOR gate 141 goes to a logic "low" level, i.e. upon the completion of sensing, NOR gate 141 ensures that the read control signal $\phi_{read}$ goes to a logic "high" level.

In FIG. 4E there is shown a read ending control signal generating circuit 150 for generating the read ending control signal $\phi_{sfin}$ in response to the read control signal $\phi_{read}$. The read ending control signal generating circuit 150 includes inverters 151 to 154, delay circuits 155 and 156 and a NAND gate 157. As further illustrated in FIG. 5, a third clock generating circuit 158, which includes inverters 151 and 152, delay circuit 155, and NAND gate 157, serves to detect the transition of the read control signal $\phi_{read}$ to a logic "low" level and to generate a logic "high" level short pulse. The logic "high" level short pulse from clock generating circuit 158 causes the read ending control signal $\phi_{sfin}$ to be output after a time delay of the delay circuit 56.

A read operation of the circuits shown in FIGS. 1 and 2 will be explained with reference to FIGS. 5 and 6.

After receiving a read command indicative of a read operation mode, column and row address signals are latched to the address buffer (not shown). Consequently, the address latch ending signal $\overline{ALE}_{end}$ stays at a logic "low" level for a short time, and then the read operation control signal ROP from the read operation control signal generating circuit 80 shown in FIG. 4A goes from a logic "low" level to a logic "high" level at time $t_1$, as shown in FIG. 5.

The reference voltage generating circuit 10 of FIG. 2 generates the precharge level control signal BLSH for setting the precharge voltage level on the bit line BL, i.e. the reference voltage $V_P$, which is, for example, about 2 volts when the power supply voltage $V_{cc}$ is about 3.3 volts. The control signal generating circuit 90 of FIG. 4B generates the isolation control signal $\phi_{SBL}$ and the initialization control signal $\phi_{DCB}$, each of which goes from a "low" level to a "high" level in response to the transition of the signal ROP to a logic "high" level. As a result, N-type transistors 28 and 30 are turned on and bit line BL is discharged to a ground potential $V_{SS}$ through conductive transistors 16 and 18.

Simultaneously, node 22 is discharged to a ground potential $V_{SS}$ and node 24 is thereby initialized to a logic "high" level. The initialization control signal $\phi_{DCB}$ is held at a "high" level, so that the voltage on bit line BL is fully discharged to the ground potential $V_{SS}$. Upon completion of the initialization operation, the isolation control signal $\phi_{SBL}$ and the initialization control signal $\phi_{DCB}$ go to logic "low" levels, and transistors 28 and 30 are thereby turned off.

At time $t_2$ in FIG. 5, precharge control signal generating circuit 105 of FIG. 4B generates the precharge control signal $\phi_{pre}$ going from a logic "low" level to a logic "high" level, and line 54 goes to a logic "low" level by the conductive transistor 52. As a result, P-type transistor 40 is fully turned on, and thereby a large amount of precharge current is supplied to data sense line 26 and bit line BL. Therefore, bit line BL is rapidly precharged to a voltage level lower than the precharge level control signal BLSH, i.e. the reference voltage $V_P$, from the reference voltage generating circuit 10. That is, bit line BL is precharged to a voltage level of $V_P-V_{th}$, wherein $V_{th}$ is a threshold voltage of N-type transistor 16. Hence, the bit line BL having a large parasitic capacitance $C_{bl}$ is rapidly precharged to the voltage level of $V_P-V_{th}$ by the large amount of precharge current from current supply circuit 12, while data sense line 26 is precharged to a power supply voltage $V_{cc}$.

Thereafter, at time $t_3$ in FIG. 5, the precharge control signal $\phi_{pre}$ goes to a logic "low" level, thereby completing the operation for precharging bit line BL. Then, an operation for sensing the data stored in a selected memory transistor is started. In response to the precharge control signal $\phi_{pre}$ going to the logic "low" level, N-type transistor 52 is turned off and P-type transistor 42 is turned on. Since transistors 48 and 50 have been turned on respectively by the reference voltage $V_{ref}$ and the sense control signal $\phi_{sae}$ staying at the logic "high" level, line 54 takes a preselected voltage such that transistor 40 supplies a minute sensing current $I_{sen}$, for example, a sensing current of about 4 μA. The preselected voltage on line 54 is, for example, approximately 2 volts when the power supply voltage $V_{cc}$ is 3.3 volts.

Next, data stored in the memory transistor M1 of FIG. 1 is to be read out. A read potential, such as a ground potential $V_{SS}$, is applied to word line WL1, and a power supply voltage $V_{cc}$ is applied to first and second selection lines SG1 and SG2 and word lines WL2 to WL16. Further assume that the memory transistor M1 stores logic "0" data. Since the memory transistor M1 acts as a depletion mode transistor, it remains in a turned on state.

Figure 6:
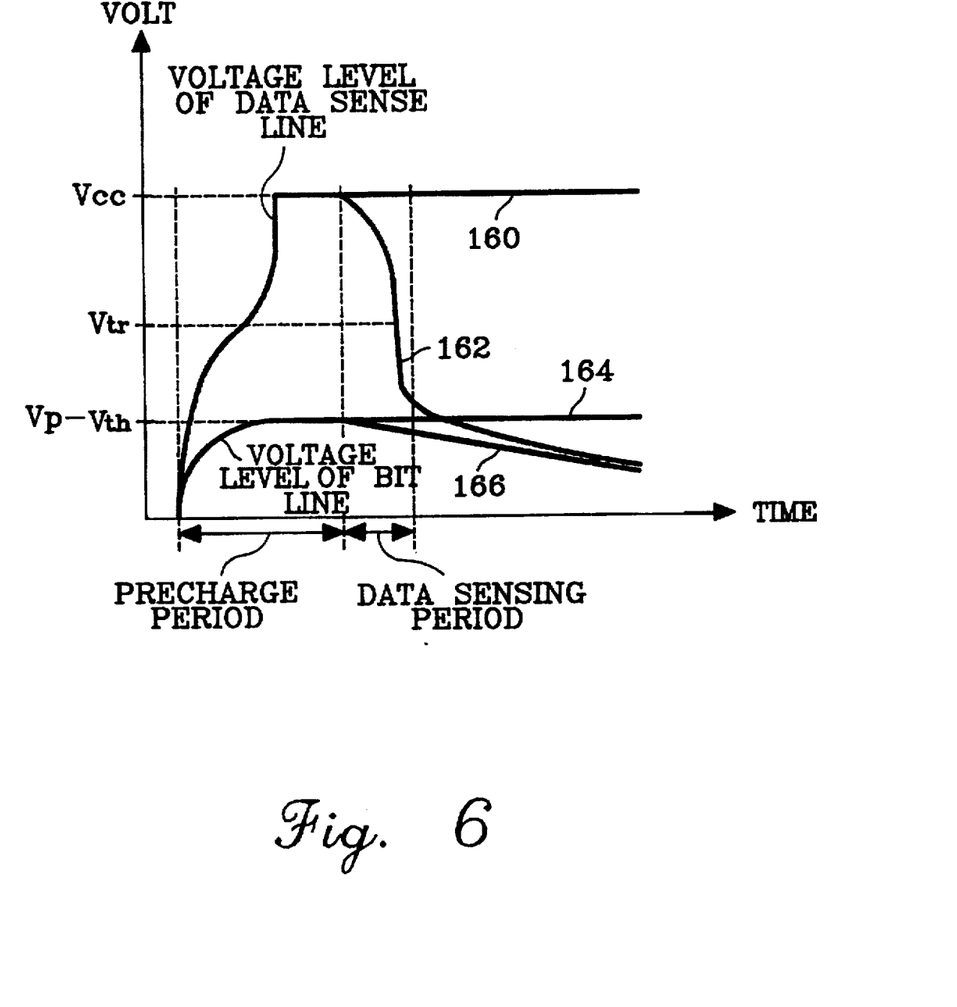
FIG. 6 is a timing diagram illustrating a sensing operation of a data sense circuit of FIG. 2.

During a data sensing period shown in FIG. 6 after the time $t_3$ shown in FIG. 5, the current flowing to ground through memory transistor M1 is greater than the sense current $I_{sen}$ supplied from the current supply circuit 12. Thus, the precharge voltage held by the parasitic capacitor $C_{bl}$ of bit line BL is lowered somewhat. Since the capacitance of parasitic capacitor $C_{bl}$ of bit line BL is much higher than that of the parasitic capacitor $C_{so}$ of data sense line 26, the variation from the precharge voltage $V_{cc}$ on data sense line 26 is significantly amplified with respect to the small variation from the precharge voltage on bit line BL, i.e. from $V_P-V_{th}$ as can be seen from the lines 166 and 162 of FIG. 6.

As shown by line 162 in FIG. 6, the voltage on data sense line 26 goes below the trip voltage $V_{tr}$ of sense amplifier 14 within a short time period. Consequently, the data sensing operation can be completed within the short time period. That is, the amplification of sense amplifier 14 depends on a ratio of the bit line parasitic capacitance $C_{bl}$ to the data sense line parasitic capacitance $C_{so}$. Therefore, the greater the ratio, the higher the sensing speed.

On the other hand, when the data stored in memory transistor M1 is logic "1" data, since memory transistor M1 acts as an enhancement mode transistor, it is turned off. Therefore, the voltage level on the precharged bit line BL is not changed, as shown by line 164 of FIG. 6, and thereby data sense line 26, as shown by line 160, maintains the precharge voltage $V_{cc}$.

As discussed above, the voltage level on data sense line 26 is determined in accordance with the data stored in the selected memory transistor during the data sensing period between time $t_3$ and $t_4$ in FIG. 5. Thereafter, at time $t_4$, the latch control signal $\phi_{lat}$ is activated from a logic "low" level to a logic "high" level. Then, N-type transistor 38 is turned on and data latch circuit 33 latches the data depending on the voltage level on data sense line 26 according to the data stored in the selected memory transistor.

That is, since the selection of a memory transistor storing logic "0" data causes the voltage level on data sense line 26 to drop below the trip voltage $V_{tr}$ of the sense amplifier 14, N-type transistor 36 is turned off and data latch circuit 33 maintains the logic "0" data stored at node 22 in the initialization operation performed during the period from time $t_1$ to time $t_2$ in FIG. 5. To the contrary, since the selection of a memory transistor storing the logic "1" data causes the voltage level on data sense line 26 to be maintained at the precharge voltage $V_{cc}$, N-type transistor 36 is turned on and thereby data latch circuit 33 allows the logic "0" data stored at node 22 in the initialization operation to be changed into logic "1" data. After the data latch operation of data latch circuit 33, the latch control signal $\phi_{lat}$ goes to a logic "low" level, and thereby N-type transistor 38 is turned off. Therefore, the data sense circuit is non-activated.

At time $t_5$ in FIG. 5, tristate inverter 58 is activated in response to the transition of the read control signal $\phi_{read}$ to a logic "high" level, thereby outputting the data stored in data latch circuit 33 to the data output buffer. At time $t_6$ in FIG. 5, the read operation control signal generating circuit 80 of FIG. 4A generates the read operation control signal ROP going to a logic "low" level, in response to the transition of the read ending control signal $\phi_{sfin}$ to a logic "high" level, thereby terminating the data read operation. Furthermore, the reference voltage generating circuit 10 causes the reference voltage $V_P$, which determines a precharge voltage of the bit line BL, to go to the power supply voltage $V_{cc}$ in response to the read operation control signal ROP going to the logic "low" level.

Figure 7:
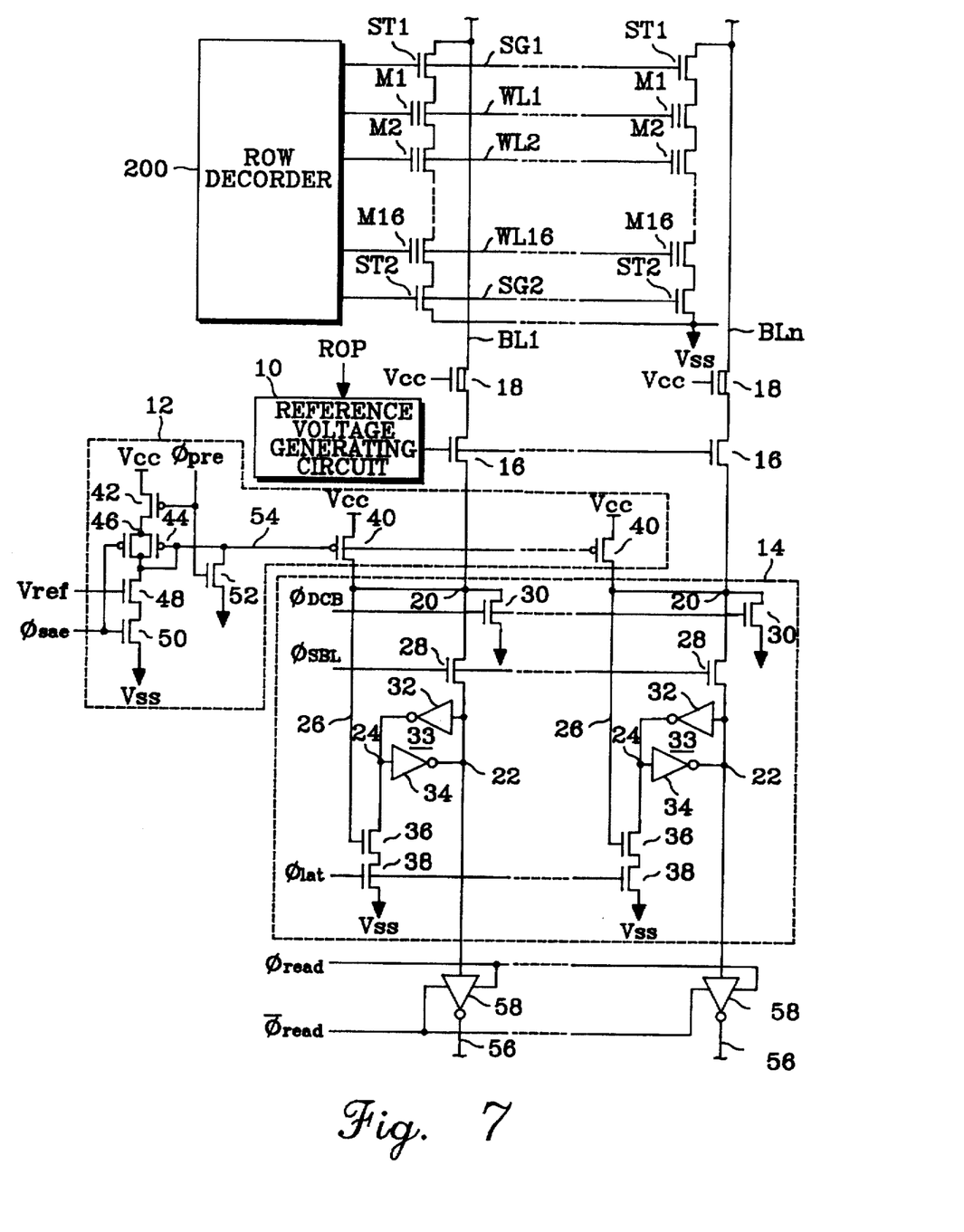
FIG. 7 is a circuit diagram illustrating a data read-out circuit according to another embodiment of the present invention.

The data read operation was described in detail above in connection with a single bit line, but the data read operation relating to a plurality of bit lines BL1 to BLn, as illustrated in FIG. 7, may be performed in a similar manner to the above-mentioned read operation. A difference therebetween is that data is simultaneously read out from memory transistors connected to a selected word line. That is, except for a page read operation, precharging of bit lines BL1 to BLn, and data sensing and latching for selected memory transistors, are performed the same as the operations described above. In the drawing of FIG. 7, reference numeral 200 indicates a row decoder whose circuit construction and operation are disclosed in U.S. Pat. No. 5,473,563.

Although the present invention has been described in connection with bit lines connected to the NAND cell units, it should be noted that the present invention is not limited to such types of memory cells. For example, a plurality of memory cells, each of which includes a selection transistor and a memory transistor which are connected in series, may be connected in parallel between each bit line and a ground potential, or a plurality of split-gate channel type memory cells may be connected in parallel therebetween.

As discussed above, since the present invention includes circuits connected between a bit line having a large parasitic capacitance and a data sense line having a relatively small parasitic capacitance, for controlling a precharge voltage level on the bit line below the level of the power supply voltage $V_{cc}$, and a current supplying circuit connected to the data sense line for supplying a large amount of current during a precharging operation and a small amount of current during a data sensing operation, precharging the bit line can be accomplished at high speed. During the data sensing operation, since the variation of the voltage level on the data sense line is considerably amplified even for a small variation of the voltage level on the bit line, data sensing speed can be considerably improved. The present invention also has an advantage of enhancing a noise immunity since a small minute current is supplied to the bit line during the data sensing operation.

Although the present invention has been described in detail above with reference with the preferred embodiments thereof, those skilled in the art will readily appreciate that various substitutions and modifications can be made thereto without departing from the spirit and scope of the invention as set forth in the appended claims.

What is claimed is:

1. A data read circuit for a nonvolatile semiconductor memory having at least one bit line, and a plurality of memory transistors connected to said bit line, said circuit comprising:

at least one data sense line;

a precharge voltage circuit connected between said bit line and said data sense line, said precharge voltage circuit providing a precharge voltage on said bit line having a preselected precharge level;

a current supplying circuit which supplies a precharge current to said data sense line such that said bit line is precharged to said preselected precharge level in correspondence with said precharge voltage circuit, and which supplies a sense current to said data sense line such that the voltage variation of the bit line from said preselected precharge level based on data stored in a selected one of said memory transistors connected to said bit line is amplified in accordance with the corresponding voltage variation of said data sense line; and a sense amplifier coupled to said data sense line which senses and latches said stored data according to said amplified voltage variation.

2. The data read circuit according to claim 1, wherein said preselected precharge level is lower than a power supply voltage level.

3. The data read circuit according to claim 1, wherein said sense current is lower than said precharge current.

4. The data read circuit according to claim 1, wherein said precharge voltage circuit comprises a transistor connected between said bit line and said data sense line and a reference voltage generating circuit which supplies a reference voltage to a control gate of said transistor.

5. The data read circuit according to claim 4, wherein said precharge voltage level is less than the level of said reference voltage.

6. The data read circuit according to claim 4, wherein said transistor is an N-type transistor.

7. The data read circuit according to claim 1, wherein said precharge voltage level is less than one third the level of said power supply voltage.

8. The data read circuit according to claim 1, wherein the corresponding voltage variation on said data sense line amplifies the voltage variation on said bit line based upon a ratio of a parasitic capacitance of said bit line to a parasitic capacitance of said data sense line.

9. The data read circuit according to claim 8, wherein said bit line parasitic capacitance is greater than said data sense line parasitic capacitance.

10. The data read circuit according to claim 1, wherein said current supply circuit supplies said precharge current and said sense current in response to a precharge control signal.

11. The data read circuit according to claim 10, wherein said current supply circuit is a current mirror type.

12. The data read circuit according to claim 4, wherein the level of said reference voltage is approximately equal to a trip voltage level of said sense amplifier.

13. A data read circuit for a nonvolatile semiconductor memory having a plurality of bit lines and a plurality of NAND cell units connected to each of said bit lines, each NAND cell unit including a plurality of series-connected memory transistors, said circuit comprising:

a plurality of data sense lines;

a plurality of transistors, each of said transistors having a channel connected between a corresponding one of said bit lines and a corresponding one of said data sense lines;

a reference voltage generating circuit which supplies a preselected voltage level to gates of each of said plurality of transistors;

a current supplying circuit which supplies a precharge current to each of said data sense lines such that said each bit line is precharged to a precharge voltage level lower than said preselected voltage level in correspondence with said reference voltage generating circuit, and such that each of said data sense lines is precharged to a power supply voltage level, said current supplying circuit also supplying a sense current lower than said precharge current to each of said data sense lines such that the voltage variation from said precharge voltage level according to data stored in selected ones of said memory transistors within selected NAND cell units connected to corresponding ones of each of said bit lines is amplified in accordance with the corresponding voltage variation from said power supply voltage level on said corresponding ones of said data sense lines; and a plurality of sense amplifiers respectively connected to each of said data sense lines, which sense and latch said stored data according to the corresponding amplified voltage variation on said each of said data sense lines.

14. The data read circuit according to claim 13, wherein said reference voltage generating circuit supplies said preselected voltage such that said precharge voltage level on each of said bit lines is less than one third of said power supply voltage level.

15. A nonvolatile semiconductor memory comprising:

at least one bit line;

a plurality of memory transistors connected to said bit line;

at least one data sense line;

a precharge voltage circuit connected between said bit line and said data sense line, said precharge voltage circuit providing a precharge voltage on said bit line having a preselected precharge level;

a current supplying circuit which supplies a precharge current to said data sense line such that said bit line is precharged to said preselected precharge level in correspondence with said precharge voltage circuit, and which supplies a sense current to said data sense line such that the voltage variation of the bit line from said preselected precharge level based on data stored in a selected one of said memory transistors connected to said bit line is amplified in accordance with the corresponding voltage variation of said data sense line; and a sense amplifier coupled to said data sense line which senses and latches said stored data according to said amplified voltage variation.

16. The nonvolatile semiconductor memory according to claim 15, wherein said precharge voltage circuit comprises a transistor connected between said bit line and said data sense line and a reference voltage generating circuit which supplies a reference voltage to a control gate of said transistor.

17. The nonvolatile semiconductor memory according to claim 16, wherein said precharge voltage level is less than the level of said reference voltage.

18. The nonvolatile semiconductor memory according to claim 15, wherein the corresponding voltage variation on said data sense line amplifies the voltage variation on said bit line based upon a ratio of a parasitic capacitance of said bit line to a parasitic capacitance of said data sense line.

19. The nonvolatile semiconductor memory according to claim 18, wherein said bit line parasitic capacitance is greater than said data sense line parasitic capacitance.

20. The nonvolatile semiconductor memory according to claim 15, wherein said current supply circuit supplies said precharge current and said sense current in response to a precharge control signal.

21. A data read circuit in a semiconductor memory having at least one bit line and at least one memory transistor connected to said bit line, said semiconductor memory including a precharge mode defined by a precharge signal and a sensing mode defined by a sensing signal, said data read circuit comprising:

a precharge voltage circuit that provides a precharge voltage having a preselected precharge level to said bit line in response to said precharge signal; and a current supply circuit that supplies a precharge current in response to said precharge signal such that said bit line is charged to said preselected precharge level, and that supplies a sensing current different than said precharge current in response to said sensing signal, such that the voltage on said bit line varies from said preselected precharge level in accordance with data stored in said memory transistor.

22. The data read circuit according to claim 21, wherein said current supply circuit includes:

a current source transistor coupled between a power supply and said bit line, said current source transistor having a control gate;

a precharge control circuit coupled to said control gate, said precharge control circuit receiving said precharge signal and causing said current source transistor to supply said precharge current in response thereto; and a sensing control circuit coupled to said control gate, said sensing control circuit receiving said sensing signal and causing said current source transistor to supply said sensing current in response thereto.

* * * * *